United States Patent
Ulmer et al.

(10) Patent No.: US 10,319,878 B2
(45) Date of Patent: Jun. 11, 2019

(54) STRATIFIED QUANTUM DOT PHOSPHOR STRUCTURE

(71) Applicant: eLux Inc., Camas, WA (US)

(72) Inventors: Kurt Ulmer, Vancouver, WA (US); Alexey Koposov, Vancouver, WA (US)

(73) Assignee: eLux, Inc., Vancouver, WA (US)

( * ) Notice: Subject to any disclaimer, the term of this patent is extended or adjusted under 35 U.S.C. 154(b) by 0 days.

(21) Appl. No.: 15/849,859

(22) Filed: Dec. 21, 2017

(65) Prior Publication Data

US 2018/0138359 A1    May 17, 2018

Related U.S. Application Data

(63) Continuation-in-part of application No. 15/838,536, filed on Dec. 12, 2017, now Pat. No. 10,242,977, (Continued)

(51) Int. Cl.
*H01L 33/06* (2010.01)
*H01L 33/50* (2010.01)
(Continued)

(52) U.S. Cl.
CPC ............ *H01L 33/06* (2013.01); *H01L 33/005* (2013.01); *H01L 33/50* (2013.01); *H01L 33/502* (2013.01);
(Continued)

(58) Field of Classification Search
CPC ........ H01L 33/06; H01L 33/005; H01L 33/50
See application file for complete search history.

(56) References Cited

U.S. PATENT DOCUMENTS 5,249,733 A    10/1993    Brady et al.
5,545,291 A     8/1996    Smith et al.
(Continued)

FOREIGN PATENT DOCUMENTS

WO    WO 2016200882    12/2016

OTHER PUBLICATIONS

Knuesel et al., "Self-assembly of microopic chiplets at a liquid-liquid-solid interface . . . ", PNAS, Jan. 19, 2010, vol. 107, No. 3, 993-998.
(Continued)

*Primary Examiner* — Sitaramarao S Yechuri
(74) *Attorney, Agent, or Firm* — Law Office of Gerald Maliszewski; Gerald Maliszewski

(57) ABSTRACT

A method is presented for fabricating a light emitting diode (LED) device with a stratified quantum dot (QD) structure. The method provides an LED and a stratified QD structure is formed as follows. A first liquid precursor is deposited overlying the LED emission surface to form a transparent first barrier layer. A second liquid precursor is deposited overlying the first barrier layer to form a first layer of discrete QDs. A third liquid precursor is deposited overlying the first layer of QDs to form a transparent second barrier layer. Subsequent to each barrier layer liquid precursor deposition, an annealing is performed to cure the deposited precursor. The first and second barrier layers act to encapsulate the first layer of QDs. The LED emits a first wavelength of light, and the first layer of QDs converts the first wavelength of light to a first color of light in the visible spectrum.

17 Claims, 6 Drawing Sheets

Related U.S. Application Data which is a continuation-in-part of application No. 15/817,440, filed on Nov. 20, 2017, now Pat. No. 10,246,638, and a continuation-in-part of application No. 15/722,037, filed on Oct. 2, 2017, which is a continuation-in-part of application No. 15/691,976, filed on Aug. 31, 2017, which is a continuation-in-part of application No. 15/440,735, filed on Feb. 23, 2017, which is a continuation-in-part of application No. 15/416,882, filed on Jan. 26, 2017, which is a continuation-in-part of application No. 15/413,053, filed on Jan. 23, 2017, which is a continuation-in-part of application No. 15/412,731, filed on Jan. 23, 2017, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(51) Int. Cl.
    *H01L 33/00* (2010.01)
    *H01L 25/075* (2006.01)

(52) U.S. Cl.
    CPC ........ *H01L 25/0753* (2013.01); *H01L 33/504* (2013.01)

(56) References Cited

U.S. PATENT DOCUMENTS

| | | |
|---|---|---|
| 5,594,463 A | 1/1997 | Sakamoto |
| 5,824,186 A | 10/1998 | Smith et al. |
| 5,904,545 A | 5/1999 | Smith et al. |
| 6,274,508 B1 | 8/2001 | Jacobsen et al. |
| 6,281,038 B1 | 8/2001 | Jacobsen et al. |
| 6,316,278 B1 | 11/2001 | Jacobsen et al. |
| 6,417,025 B1 | 7/2002 | Gengel |
| 6,420,266 B1 | 7/2002 | Smith et al. |
| 6,468,638 B2 | 11/2002 | Jacobsen et al. |
| 6,479,395 B1 | 11/2002 | Smith et al. |
| 6,507,989 B1 | 1/2003 | Bowden et al. |
| 6,527,964 B1 | 3/2003 | Sakariya et al. |
| 6,555,408 B1 | 4/2003 | Jacobsen et al. |
| 6,566,744 B2 | 5/2003 | Gengel |
| 6,586,338 B2 | 7/2003 | Smith et al. |
| 6,590,346 B1 | 7/2003 | Hadley et al. |
| 6,606,247 B2 | 8/2003 | Credelle et al. |
| 6,613,610 B2 | 9/2003 | Iwafuchi et al. |
| 6,618,030 B2 | 9/2003 | Kane et al. |
| 6,623,579 B1 | 9/2003 | Smith et al. |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,687,987 B2 | 2/2004 | Mayer et al. |
| 6,723,576 B2 | 4/2004 | Nozawa et al. |
| 6,731,353 B1 | 5/2004 | Credelle et al. |
| 6,780,696 B1 | 8/2004 | Schatz |
| 6,816,380 B2 | 11/2004 | Credelle et al. |
| 6,825,499 B2 | 11/2004 | Nakajima et al. |
| 6,850,312 B2 | 2/2005 | Jacobsen et al. |
| 6,863,219 B1 | 3/2005 | Jacobsen et al. |
| 6,870,190 B2 | 3/2005 | Okuyama et al. |
| 6,919,225 B2 | 7/2005 | Craig et al. |
| 6,927,085 B2 | 8/2005 | Hadley et al. |
| 6,980,184 B1 | 12/2005 | Stewart et al. |
| 6,984,927 B2 | 1/2006 | Tomoda et al. |
| 6,985,361 B2 | 1/2006 | Credelle et al. |
| 7,046,328 B2 | 5/2006 | Jacobsen et al. |
| 7,049,207 B2 | 5/2006 | Tomoda |
| 7,049,227 B2 | 5/2006 | Tomoda et al. |
| 7,060,542 B2 | 6/2006 | Nakajima et al. |
| 7,070,851 B2 | 7/2006 | Jacobsen et al. |
| 7,080,444 B1 | 7/2006 | Craig et al. |
| 7,087,934 B2 | 8/2006 | Oohata et al. |
| 7,101,502 B2 | 9/2006 | Smith et al. |
| 7,113,250 B2 | 9/2006 | Jacobsen et al. |
| 7,122,826 B2 | 10/2006 | Okuyama et al. |
| 7,129,514 B2 | 10/2006 | Okuyama et al. |
| 7,141,176 B1 | 11/2006 | Smith et al. |
| 7,172,789 B2 | 2/2007 | Smith et al. |
| 7,179,210 B2 | 2/2007 | Soukeras |
| 7,199,527 B2 | 4/2007 | Holman |
| 7,217,592 B2 | 5/2007 | Nuggehalli et al. |
| 7,244,326 B2 | 7/2007 | Craig et al. |
| 7,250,314 B2 | 7/2007 | Nakajima et al. |
| 7,250,320 B2 | 7/2007 | Okuyama et al. |
| 7,260,882 B2 | 8/2007 | Credelle et al. |
| 7,288,432 B2 | 10/2007 | Jacobsen et al. |
| 7,317,211 B2 | 1/2008 | Watanabe et al. |
| 7,317,435 B2 | 1/2008 | Hsueh |
| 7,321,159 B2 | 1/2008 | Schatz |
| 7,353,598 B2 | 4/2008 | Craig et al. |
| 7,417,306 B1 | 8/2008 | Jacobsen et al. |
| 7,425,467 B2 | 9/2008 | Jacobsen et al. |
| 7,452,748 B1 | 11/2008 | Craig et al. |
| 7,500,610 B1 | 3/2009 | Hadley et al. |
| 7,531,218 B2 | 5/2009 | Smith et al. |
| 7,542,301 B1 | 6/2009 | Liong et al. |
| 7,561,221 B2 | 7/2009 | Jacobsen et al. |
| 7,564,064 B2 | 7/2009 | Oohata et al. |
| 7,572,649 B2 | 8/2009 | Kanemitsu et al. |
| 7,573,194 B2 | 8/2009 | Doi et al. |
| 7,576,656 B2 | 8/2009 | Craig et al. |
| 7,589,355 B2 | 9/2009 | Tomoda et al. |
| 7,615,479 B1 | 11/2009 | Craig et al. |
| 7,619,598 B2 | 11/2009 | Pulvirenti et al. |
| 7,662,008 B2 | 2/2010 | Hillis et al. |
| 7,723,764 B2 | 5/2010 | Oohata et al. |
| 7,763,901 B2 | 7/2010 | Tomoda |
| 7,774,929 B2 | 8/2010 | Jacobs |
| 7,795,049 B2 | 9/2010 | Watanabe et al. |
| 7,795,629 B2 | 9/2010 | Watanabe et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,927,976 B2 | 4/2011 | Menard |
| 7,931,063 B2 | 4/2011 | Craig et al. |
| 7,968,474 B2 | 6/2011 | Martin et al. |
| 7,977,130 B2 | 7/2011 | Hillis et al. |
| 8,068,661 B2 | 11/2011 | Onushkin et al. |
| 8,101,457 B2 | 1/2012 | Tomoda et al. |
| 8,138,868 B2 | 3/2012 | Arnold |
| 8,222,659 B2 | 7/2012 | Tomoda |
| 8,232,640 B2 | 7/2012 | Tomoda et al. |
| 8,252,164 B2 | 8/2012 | Martin et al. |
| 8,257,538 B2 | 9/2012 | Doi et al. |
| 8,284,120 B2 | 10/2012 | Hillis et al. |
| 8,300,007 B2 | 10/2012 | Hillis et al. |
| 8,312,619 B2 | 11/2012 | Chow et al. |
| 8,333,860 B1 | 12/2012 | Bibl et al. |
| 8,349,116 B1 | 1/2013 | Bibl et al. |
| 8,361,268 B2 | 1/2013 | Mizuno et al. |

(56) References Cited

U.S. PATENT DOCUMENTS

| | | |
|---|---|---|
| 8,361,297 B2 | 1/2013 | Mayer et al. |
| 8,379,003 B2 | 2/2013 | Kawaguchi et al. |
| 8,382,544 B2 | 2/2013 | Hillis et al. |
| 8,383,506 B1 | 2/2013 | Golda et al. |
| 8,384,116 B2 | 2/2013 | Ohtorii et al. |
| 8,390,537 B2 | 3/2013 | Hillis et al. |
| 8,409,886 B2 | 4/2013 | Iwafuchi et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,415,879 B2 | 4/2013 | Lowenthal et al. |
| 8,426,227 B1 | 4/2013 | Bibl et al. |
| 8,476,826 B2 | 7/2013 | Oohata et al. |
| 8,518,204 B2 | 8/2013 | Hu et al. |
| 8,552,436 B2 | 10/2013 | Bibl et al. |
| 8,558,243 B2 | 10/2013 | Bibl et al. |
| 8,569,115 B1 | 10/2013 | Golda et al. |
| 8,570,482 B2 | 10/2013 | Hillis et al. |
| 8,573,469 B2 | 11/2013 | Hu et al. |
| 8,628,994 B2 | 1/2014 | Tomoda |
| 8,646,505 B2 | 2/2014 | Bibl et al. |
| 8,648,328 B2 | 2/2014 | Crowder et al. |
| 8,669,703 B2 | 3/2014 | Hillis et al. |
| 8,683,416 B1 | 3/2014 | Trivedi et al. |
| 8,685,774 B2 | 4/2014 | Crowder et al. |
| 8,686,447 B2 | 4/2014 | Tomoda et al. |
| 8,686,542 B2 | 4/2014 | Golda et al. |
| 8,711,063 B2 | 4/2014 | Hillis et al. |
| 8,789,573 B2 | 7/2014 | Bibl et al. |
| 8,809,126 B2 | 8/2014 | Lowenthal et al. |
| 8,846,457 B2 | 9/2014 | Lowenthal et al. |
| 8,906,713 B2 | 12/2014 | Rettke |
| 9,240,397 B2 | 1/2016 | Bibl et al. |
| 9,245,875 B2 | 1/2016 | Karlicek et al. |
| 9,252,375 B2 | 2/2016 | Bibl et al. |
| 9,269,322 B2 | 2/2016 | Nathan et al. |
| 9,293,476 B2 | 3/2016 | Bedell et al. |
| 9,305,807 B2 | 4/2016 | Whiting et al. |
| 9,318,475 B2 | 4/2016 | Bibl et al. |
| 9,343,448 B2 | 5/2016 | Sakariya et al. |
| 2002/0153606 A1 | 10/2002 | Gengel |
| 2005/0206585 A1 | 9/2005 | Stewart et al. |
| 2005/0233504 A1 | 10/2005 | Doi et al. |
| 2010/0186883 A1 | 7/2010 | Tomoda |
| 2010/0252843 A1* | 10/2010 | Ohashi .................. H01L 33/483 257/91 |
| 2011/0266039 A1 | 11/2011 | Tomoda |
| 2011/0273410 A1 | 11/2011 | Park et al. |
| 2012/0169786 A1 | 7/2012 | Okuyama et al. |
| 2012/0195340 A1* | 8/2012 | Cheon .................. H01L 33/501 372/50.1 |
| 2012/0218318 A1 | 8/2012 | Hirao et al. |
| 2012/0219788 A1* | 8/2012 | Hildenbrand ............ C08J 7/045 428/328 |
| 2012/0248479 A1* | 10/2012 | Anc ....................... H01L 33/504 257/98 |
| 2012/0250351 A1 | 10/2012 | Shin et al. |
| 2013/0126098 A1 | 5/2013 | Bibl et al. |
| 2013/0126827 A1 | 5/2013 | Bibl et al. |
| 2013/0128585 A1 | 5/2013 | Bibl et al. |
| 2013/0210194 A1 | 8/2013 | Bibl et al. |
| 2013/0341590 A1* | 12/2013 | Gupta .................... H01L 33/06 257/13 |
| 2014/0008691 A1 | 1/2014 | Tomoda et al. |
| 2014/0048909 A1 | 2/2014 | Golda et al. |
| 2014/0084482 A1 | 3/2014 | Hu et al. |
| 2014/0110724 A1* | 4/2014 | Huang ................ H01L 25/0753 257/88 |
| 2014/0277680 A1 | 9/2014 | Youngquist |
| 2014/0339495 A1 | 11/2014 | Bibl et al. |
| 2014/0367633 A1* | 12/2014 | Bibl .................. G02F 1/133603 257/13 |
| 2015/0048390 A1* | 2/2015 | Imazu ................ H01L 25/0756 257/88 |
| 2015/0155445 A1 | 6/2015 | Zhan et al. |
| 2015/0179877 A1 | 6/2015 | Hu et al. |
| 2015/0214430 A1 | 7/2015 | Zhan et al. |
| 2015/0263066 A1 | 9/2015 | Hu et al. |
| 2016/0086534 A1 | 3/2016 | Seo et al. |
| 2017/0062393 A1 | 3/2017 | Kim |
| 2017/0229330 A1 | 8/2017 | Tkachenko et al. |
| 2018/0237337 A1* | 8/2018 | Couillard .............. C03C 27/044 |

OTHER PUBLICATIONS

Mastrangeli et al., "Self-assembly from milli- to nanoscales: methods and applications", J Micromech Microeng, Jul. 8, 2009; 19(8): 083001.
Michel Danek et al., "Synthesis of Luminescent Thin-Film CdSe/ZnSe Quantum Dot Composites Using CdSe Quantum Dots . . . ", Chem. Mater., 1996, 8 (1), pp. 173-180.
Octavi E. Semonin et al., "Peak External Photocurrent Quantum Efficiency Exceeding 100% via MEG in a Quantum Dot Solar Cell", Science, vol. 334, Issue 6062, pp. 1530-1533.
Yasuhiro Shirasaki et al., "Emergence of colloidal quantum-dot light-emitting technologies", Nature Photonics 7, 13-23 (2013).
U.S. Appl. No. 14/749,569, Sasaki et al.
U.S. Appl. No. 15/221,571, Crowder et al.
U.S. Appl. No. 15/190,813, Scheuele et al.
U.S. Appl. No. 15/158,556, Zhan et al.
U.S. Appl. No. 15/266,796, Heine et al.
US 8,093,720, Jan. 2012, Sony (withdrawn)
U.S. Appl. No. 14/305,295, pending, LED Display Driving Circuits.
Bui, Thanh Son, et al. "High optical density and low dielectric constant black matrix containing graphene oxide and carbon black . . . " Displays 34.3 (2013): 192-199.
Den Boer, Willem. Active matrix liquid crystal displays: fundamentals and applications. Elsevier, 2011.
E. Feldtkeller, Review on domains in Thin Magnetic Samples, J. Phys. Colloques 1971, 32, C1-452.
Park, S.-C., et al., A First implementation of an Automated Reel-to-Reel Fluidic Self-Assembly Machine, Adv. Mater., 2014 26: 5942-5949.
Gach et al., Transparent Magnetic Photoresists for Bioanalytical Applications, Biomaterials, Nov. 2010; 31 (33): 8810-8817.
Plouffe et al., Fundamentals and Application of Magnetic Particles in Cell Isolattion and Enrichment, Rep Frog Phys. Jan. 2015; 78(1).

* cited by examiner

STRATIFIED QUANTUM DOT PHOSPHOR STRUCTURE

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to quantum dot (QD) emissions and, more particularly, to a light emitting diode (LED) device with a stratified QD color conversion structure.

2. Description of the Related Art

Quantum dots (QDs), or semiconducting nanocrystals are chemical objects sized from 1 to about 20 nanometers (nm), depending on the material, to bulk materials. Since first being fabricated through molecular beam epitaxy, QDs have evoked interest as their band gap was found to be tunable with the size of the structure. Decades later, a solution-based approach for fabrication of QDs through colloidal chemistry brought significant attention to these materials. Colloidal syntheses allowed for the preparation of a material of any size and varied chemical composition, with almost any optical band gap. Further, the solution-based approach proved to a feasible route to scale up the preparation of QDs in commercially significant amounts. The control of the optical band gap led to the tunability of optical properties, such as emission and absorbance. Such tunability of physical properties ultimately dictated the potential application of the QD materials, as the tunability of absorbance spectrum was found to be useful for solar cell applications, while the tunability of emission properties allowed these materials to be utilized in the generation of light at specific wavelengths for display and lighting applications.

Currently, there are two major strategies for incorporating QDs in light emitting devices. The first strategy uses direct emitting LEDs, where charges are directly injected into QDs through the LED structure, leading to radiative recombination. In the second strategy, QDs are utilized as color conversion materials, as explained in more detail below.

FIGS. 1A and 1B depict LEDs utilizing different color conversion techniques (prior art). FIG. 1A depicts a remote phosphor color conversion technique where the QDs are embedded in a film 100 and irradiated by blue or ultraviolet (UV) LED 102, and where the LED is physically separated from the color converter. As shown, light is delivered to the color conversion film via a waveguide 104 and reflector 106. FIG. 1B depicts the second type of color conversion, where the QD embedded film 100 is placed directly on LED 102, with or without a spacer (not shown).

The "directly on LED" approach of FIG. 1B permits the fabrication of more efficient emitting devices that require substantially less QD material. However, despite these benefits, this approach has several technological challenges. These challenges include: high operating temperatures (often above 100° C.) due to proximity to the light emitting LED, high photon flux, and the tight packing of the QD materials due to miniaturization. These factors generally lead to emission quenching through different mechanisms, which reduces conversion efficiency.

These harsh operating conditions dictate the packaging of QD materials to prevent not only emission quenching due to the set of factors outlined above, but also from various degradation processes (photooxidation, for instance). Such packaging is generally performed by incorporating the QD material into a polymeric matrix, which is generally based on epoxy, methacrylate, or silicone polymers. In a typical LED fabrication process, QDs are dispersed in a matrix material with or without additional nanoparticles (such as $SiO_2$ or $Al_2O_3$ nanoparticles, which are used for the light scattering), forming a paste. The selection of the matrix material is based upon the nature of the QD and the ligands surrounding the QD. In the ideal scenario, all QDs should be uniformly dispersed within the cured paste to minimize interactions between the individual QDs. These interactions, such as charge and energy transfers, lead to diminished emission intensity, which ultimately reflects lower LED performance. The QD-containing paste is deposited through a number of possible techniques on top of the LED or inside an LED cavity, and cured. Depending on the architecture of the LED and QD color conversion, a gap between the LED itself and QD in a matrix material can be introduced to minimize the effect of temperature on the QD performance. Such a gap can be either an air gap or an additional layer of polymeric material. Similar issues apply to micro-LED devices. However, the miniaturization of micro-sized light emitting structures delivers another set of challenges, while the previously outlined problems still remain.

While preparation of the pastes with QDs in matrix materials is a common procedure, its applicable can be problematic for miniaturized devices based on micro-LEDs. In particular, in order to maintain complete light conversion, the thickness of the QD-containing film is strongly dependent upon the loading of the QDs in a matrix material. However, for the majority QD/matrix combinations the final film thickness is outside the range acceptable by the micro-LED technology. Due to relatively low concentration of the QDs in the matrix material the film must be relatively thick. In addition, the majority of the common materials system used for the preparation of such color converting pastes have the viscosity substantially higher than is needed for the inkjet deposition—a desired process for the deposition of the color converters on a distributed array of micro-LEDs.

While conventional color conversion applications utilize QDs dispersed in a matrix for the above-mentioned reasons, thin layers of QDs (not embedded in a matrix) have been utilized for the fabrication of field-effect transistors (FET) and solar cells. However, such applications dictate a different set of constrains on the QD materials that are focused on the interactions between QDs to facilitate charge transport between the nanocrystals. These constrains are not applicable to color conversion structures, where charge transport does not take place and the interactions between QDs must be minimized. As a result, thin layers of discrete QDs have not been utilized for color conversion applications.

It would be advantageous if QDs used for color conversion could be evenly distributed without being embedded in a matrix material.

SUMMARY OF THE INVENTION

Disclosed herein is a micro-light emitting diode (LED) structure, where quantum dots (QDs) for color conversion are applied directly on the LED as a film of discrete particles without being embedded in a polymeric matrix material. The film of QDs may be sandwiched between two encapsulation layers, which separate the bare QDs from the environment. Multiple film layers containing either red or green emitting QDs can be applied in the same manner. Such a structure for color conversion of the LED light permits the use of a minimal amount of QDs and enabled less expensive QD deposition processing techniques.

Accordingly, a method is presented for fabricating an LED device with a stratified quantum dot structure. The method provides an LED having a light emission surface, and a stratified QD structure is formed as follows. A first liquid precursor is deposited overlying the LED emission surface to form a transparent first barrier layer. A second liquid precursor is deposited overlying the first barrier layer to form a first layer of discrete QDs. The term "discrete QDs" is intended to describe a layer of QDs that is not embedded in a matrix material, as would be the case if the QDs were mixed with a polymer and applied as a paste. A third liquid precursor is deposited overlying the first layer of QDs to form a transparent second barrier layer. Subsequent to each barrier layer liquid precursor deposition, an annealing is performed to cure the deposited precursor. The liquid QD-containing precursors require a drying step to remove the solvent. Using such an approach allows the QDs to form a completely distinct layer without any mixing with the barrier layers. The first and second barrier layers act to encapsulate the first layer of QDs. Typically, the first and second barrier layers are an epoxy, methacrylate, silicon polymer, or an alternative polymer material having an index of refraction greater than or equal to 1.4 for efficient light extraction from the LED.

In one aspect the LED emission surface emits a first wavelength of light, which may be a color (e.g., blue) in the visible spectrum or ultraviolet (UV) for example. Then, the first layer of QDs emit a first color of light in the visible spectrum (e.g., red or green), different than the first wavelength of light, in response to converting the first wavelength of light.

In some aspects, the method of forming the stratified QD structure includes additional steps. A fourth liquid precursor is deposited overlying the second barrier level to form a second layer of discrete QDs, and a fifth liquid precursor is deposited overlying the second layer of QDs to form a transparent third barrier layer. The second layer of QDs emits a second color of light in the visible spectrum, different than the first color and the first wavelength of light, in response to converting the first wavelength of light. For example, if the first wavelength of light is a blue color, the first color is green, and the second color red, the overall emission from the device would be a white color.

In one aspect a substrate is provided with a plurality of wells formed in a top surface of the substrate, and a plurality of LEDs are provided, with each LED occupying a corresponding well with the emission surface exposed. In this aspect a plurality of stratified QD structures are formed with the first, second, and third precursors sequentially deposited in the well overlying each corresponding LED. The deposition of the first liquid precursor may fill the space (if any) existing between the LED and a well sidewall. In one variation a fourth liquid precursor is deposited overlying the second barrier level to form a second layer of discrete QDs, and a fifth liquid precursor is deposited overlying the second layer of QDs to form a transparent third barrier layer. As above, the first layer of QDs emits a first color of light in the visible spectrum, different than the first wavelength of light, in response to converting the first wavelength of light. The second layer of QDs emits a second color of light in the visible spectrum, different than the first color and the first wavelength of light, in response to converting the first wavelength of light.

In a red-green-blue (RGB) display variation the substrate includes a first plurality of LED occupied wells. In which case a second plurality (less than the first plurality) of the stratified QD structures include a first layer of QDs emitting a first color of light in the visible spectrum, different than the first wavelength of light. A second plurality of the stratified QD structures includes a first layer of QDs emitting a second color of light in the visible spectrum, different than the first color and the first wavelength of light. For example, the first wavelength of light may be a blue color, the first color green, and the second color red.

Additional details of the above-described method, an LED device with a stratified QD structure, and an LED display are provided below.

DETAILED DESCRIPTION

Figure 1A:
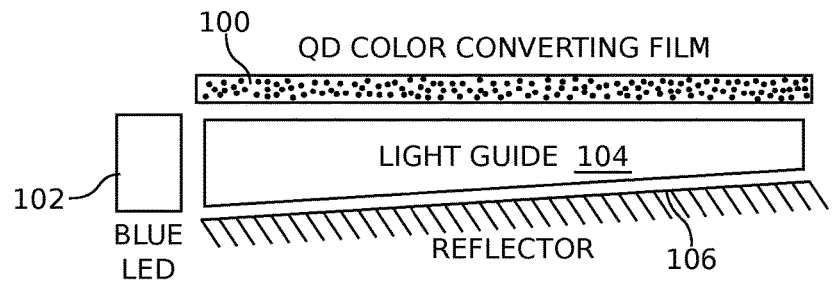
FIGS. 1A and 1B depict LEDs utilizing different color conversion techniques (prior art).
Figure 1B:
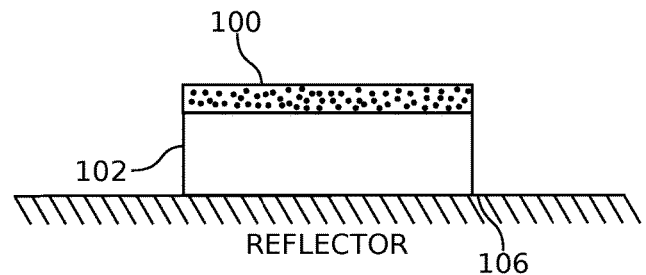
Figure 2:
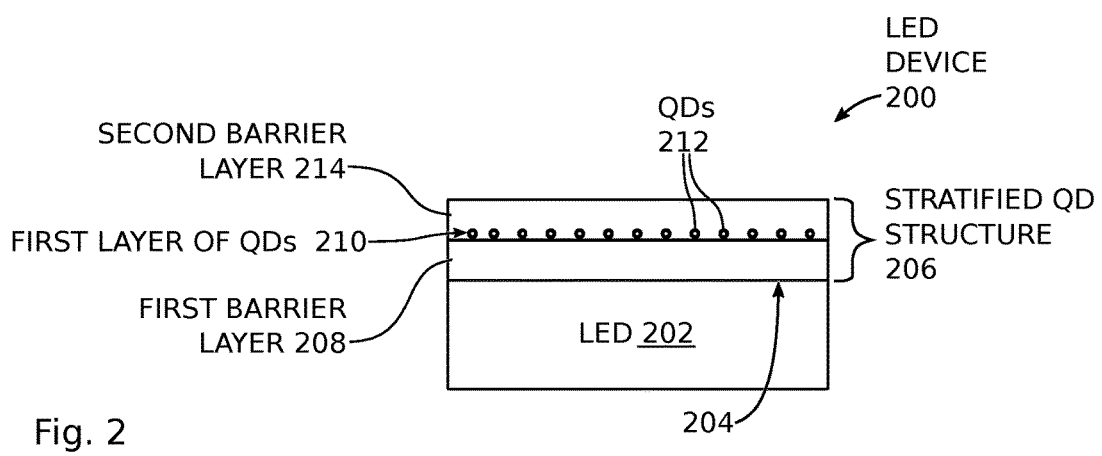
FIG. 2 is a partial cross-sectional view of a light emitting diode (LED) device with a stratified quantum dot (QD) structure.

FIG. 2 is a partial cross-sectional view of a light emitting diode (LED) device with a stratified quantum dot (QD) structure. The device 200 comprises an LED 202 having a light emission surface 204 and a stratified QD structure 206. The stratified QD structure 206 comprises a transparent first barrier layer 208 overlying the LED emission surface 204. A first layer 210 of discrete QDs 212 overlies the first barrier layer 208. A transparent second barrier layer 214 overlies the first layer 210 of QDs 212. The first barrier layer 208 and the second barrier layer 214 encapsulate the first layer 210 of QDs 212. Typically, the first 208 and second 214 barrier layers are an epoxy, methacrylate, silicon polymer, or alternative polymer material having an index of refraction greater than or equal to 1.4. The LED emission surface 204 emits a first wavelength of light, which may be in the visible spectrum (e.g., a blue color) or in the ultraviolet (UV) spectrum. The first layer 210 of QDs 212 emits a first color of light in the visible spectrum, different than the first wavelength of light, in response to converting the first wavelength of light.

Figure 3:
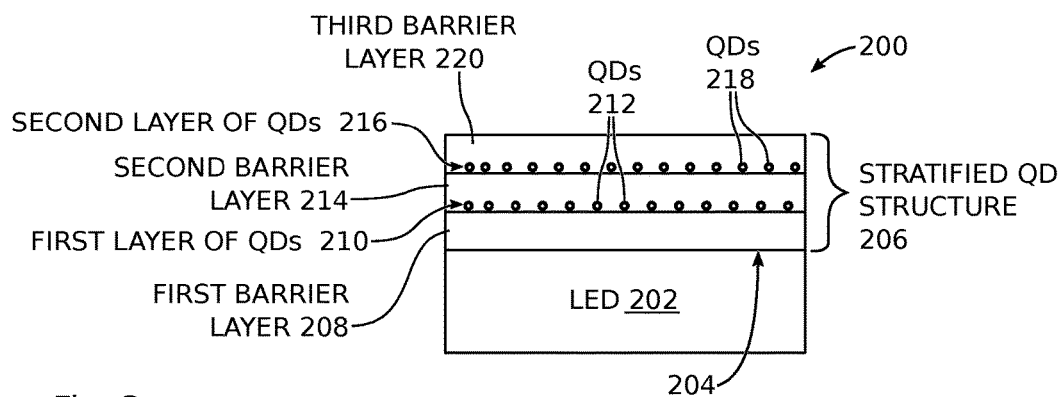
FIG. 3 is a partial cross-sectional view featuring a variation of the LED device depicted in FIG. 2.

FIG. 3 is a partial cross-sectional view featuring a variation of the LED device depicted in FIG. 2. In this aspect the stratified QD structure 206 further comprises a second layer 216 of discrete QDs 218 overlying the second barrier layer 214. A transparent third barrier layer 220 overlies the second layer 216 of QDs 218. The second layer 216 of QDs 218 emits a second color of light in the visible spectrum, different than the first color and the first wavelength of light, in response to converting the first wavelength of light.

Figure 4:
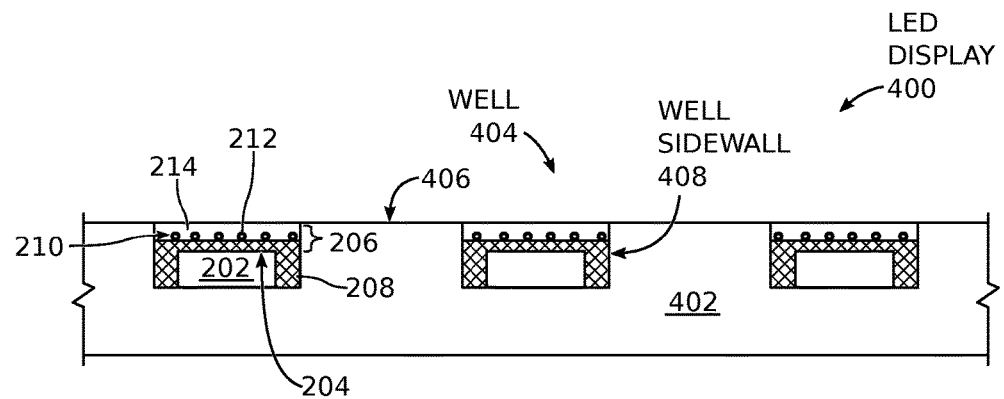
FIG. 4 is a partial cross-sectional view of an LED display.

FIG. 4 is a partial cross-sectional view of an LED display. The LED display 400 comprises a substrate 402 with a plurality of wells 404 formed in a top surface 406 of the substrate. The display 400 includes a plurality of LEDs 202. Each LED 202 occupies a corresponding well 404 and has an exposed light emission surface 204. The display 400 also comprises a plurality of stratified QD structures 206. Each stratified QD structure 206 overlies a corresponding LED 202 and is comprised of the following. A transparent first barrier layer 208 overlies the LED emission surface 204. A first layer 210 of discrete QDs 212 overlies the first barrier layer 208. A transparent second barrier layer 214 overlies the first layer 210 of QDs 212. The first barrier layer 208 and the second barrier layer 214 encapsulate the first layer 210 of QDs 212. Typically, the first 208 and second 214 barrier layers are an epoxy, methacrylate, silicon polymer, or alternative polymer material having an index of refraction greater than or equal to 1.4 for efficient light extraction from the LED and QDs. The LED emission surface 204 emits a first wavelength of light, which may be in the visible spectrum (e.g., a blue color) or in the ultraviolet (UV) spectrum. The first layer 210 of QDs 212 emits a first color of light in the visible spectrum, different than the first wavelength of light, in response to converting the first wavelength of light. In one aspect as shown, the first barrier layer 208 fills a space that may exist between the LED 202 and the well sidewall 408.

Figure 5:
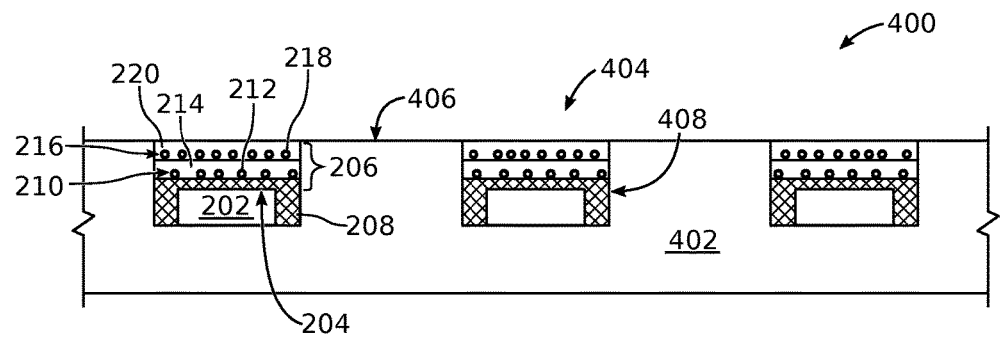
FIG. 5 is a partial cross-sectional view of a first variation of the LED display depicted in FIG. 4.

FIG. 5 is a partial cross-sectional view of a first variation of the LED display depicted in FIG. 4. As above, the LEDs 202 all emit a first wavelength of light. In this aspect, each stratified QD structure 206 further comprises a second layer 216 of discrete QDs 218 overlying the second barrier layer 214. A transparent third barrier layer 220 overlies the second layer 216 of QDs 218. The second layer 216 of QDs 218 emits a second color of light in the visible spectrum, different than the first color and the first wavelength of light, in response to converting the first wavelength of light. If the light emitted from each well is a white color, the substrate is suitable for use as a locally dimming backlight unit (BLU).

Figure 6:
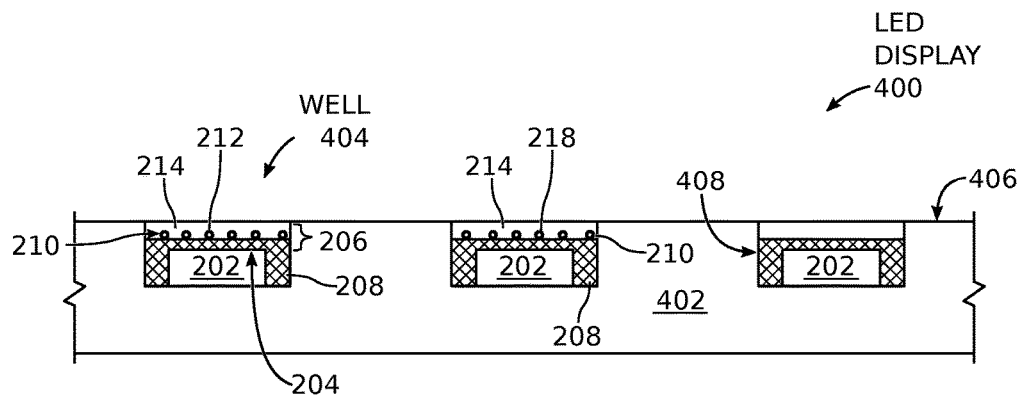
FIG. 6 is a partial cross-sectional view of a second variation of the LED display depicted in FIG. 4.

FIG. 6 is a partial cross-sectional view of a second variation of the LED display depicted in FIG. 4. A first plurality of LED emission surfaces 204 emits the first wavelength of light. A second plurality of the stratified QD structures 206 include a first layer 210 of QDs 212 emitting a first color of light in the visible spectrum, different than the first wavelength of light, in response to converting the first wavelength of light. A second plurality of the stratified QD structures include a first layer 210 of QDs 218 emitting a second color of light in the visible spectrum, different than the first color and the first wavelength of light, in response to converting the first wavelength of light. In this example, a second plurality of LED emission surfaces 204 are not covered with an overlying stratified QD structure 206, and the second plurality is equal to one-third the first plurality.

If, for example, the first wavelength is the color blue, the first color is the color green, and the second color is the color red, the display 400 is suitable as a red-green-blue (RGB) display.

Thus, a micro-LED assembly is presented with a color conversion structure having a thin layer or thin films of discrete quantum dots embedded within multiple barrier layers having a different chemical composition from the QD layer. The barrier layers and QD layers can be directly applied to the surface of a micro-LED that may be a subpart of an array of micro-LEDs.

Figure 7:
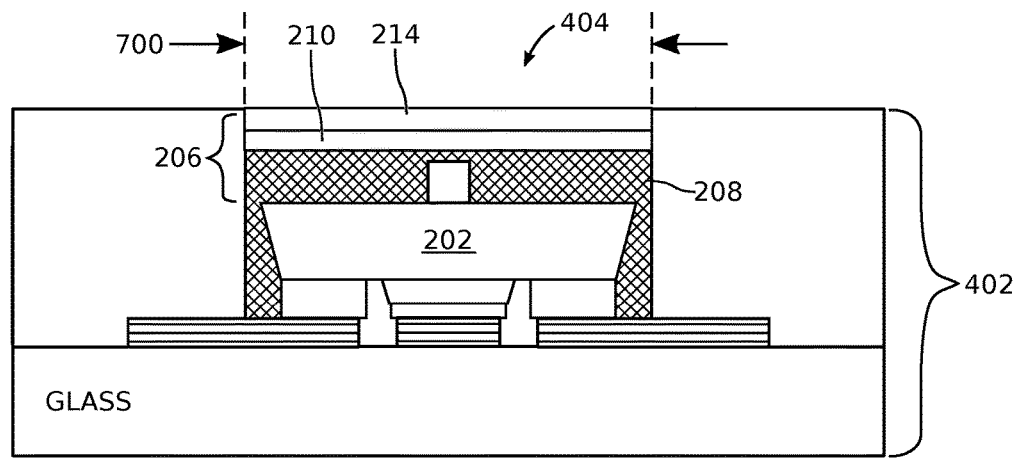
FIG. 7 is a partial cross-sectional view depicting the well structure of FIG. 4 in greater detail.

FIG. 7 is a partial cross-sectional view depicting the well structure of FIG. 4 in greater detail. The QD layer 210 is a film of QDs (discrete QDs are not shown) without any binder or matrix material. The structure is generally as described in parent U.S. Pat. No. 9,825,202, entitled DISPLAY WITH SURFACE MOUNT EMISSIVE ELEMENTS, invented by Schuele et al., and issued on Nov. 21, 2017. A well 404 is formed above display circuitry into which a micro-LED 202 is assembled from fluid and bonded in a separate process to electrodes connected to the display circuitry. After bonding the micro-LED 202 to the display circuitry, a color conversion stack, referred to herein as a stratified QD structure 206, is printed on top of the micro-LED. The well in this case additionally defines the lateral dimensions 700 of the stratified QD structure 206.

Figure 8A:
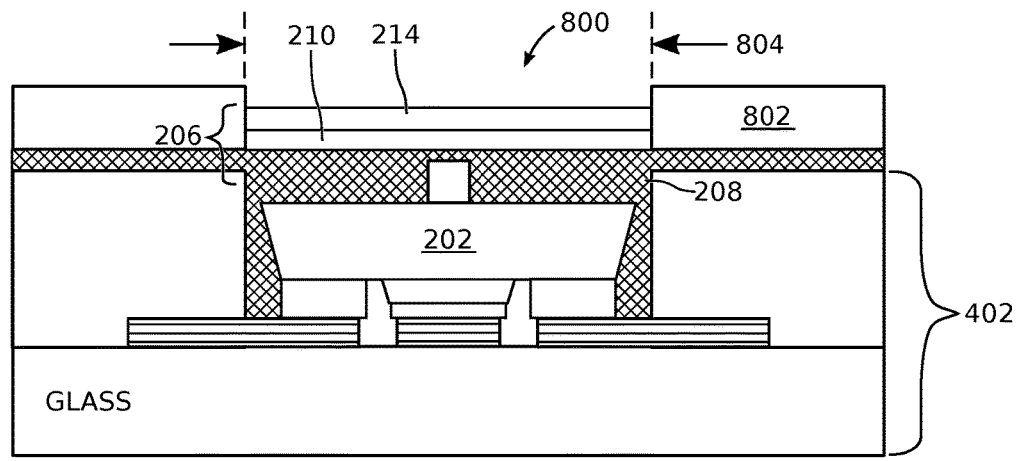
FIGS. 8A and 8B are cross-sectional views depicting the barrier layers as planarization layers.
Figure 8B:
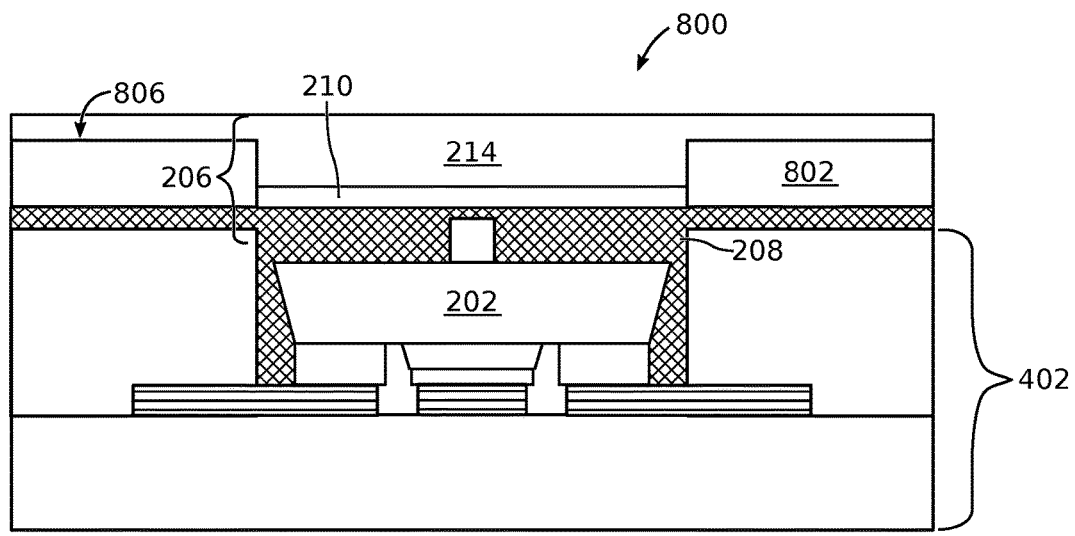

FIGS. 8A and 8B are cross-sectional views depicting the barrier layers as planarization layers. Subsequent to planarizing the first barrier layer 208, a second well structure 800 is formed in deposited film 802 above the micro-LED 202 to define the lateral dimensions 804 of the stratified QD structure 206. As shown, the well 800 may only be partially filled so that the stratified QD structure may include additional QD layers. Otherwise, the film 802 can be planarized to the level of the second barrier layer 214. As an alternative, in FIG. 8B the second barrier layer 214 fills the well 800 and overlies the top surface 806 of the film 802, and is then planarized.

In FIGS. 4 through 8B a substrate or structure with a well containing the LED is provided into which layers of the stratified QD structure are formed. Each layer is applied to the LED structure as a liquid precursor that is transformed into a final thin layer by additional processing such as raising temperature of the LED assembly. The color conversion layers are applied and processed sequentially. The thickness of barrier films and QD layers vary based on design but can be in the range of 1-500 microns (um) each.

Figure 9A:
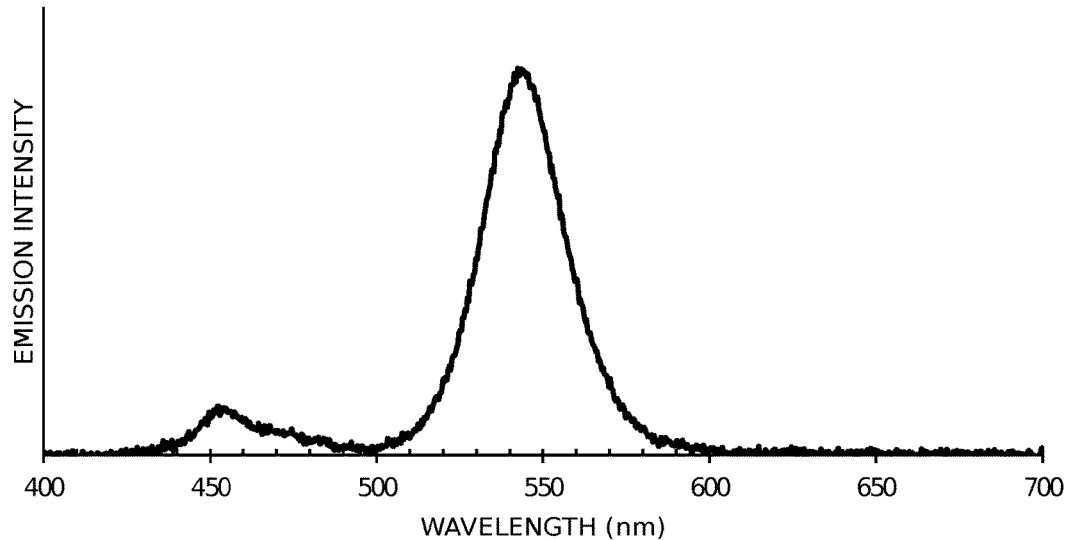
FIGS. 9A and 9B are exemplary normalized light emission intensity graphs.
Figure 9B:
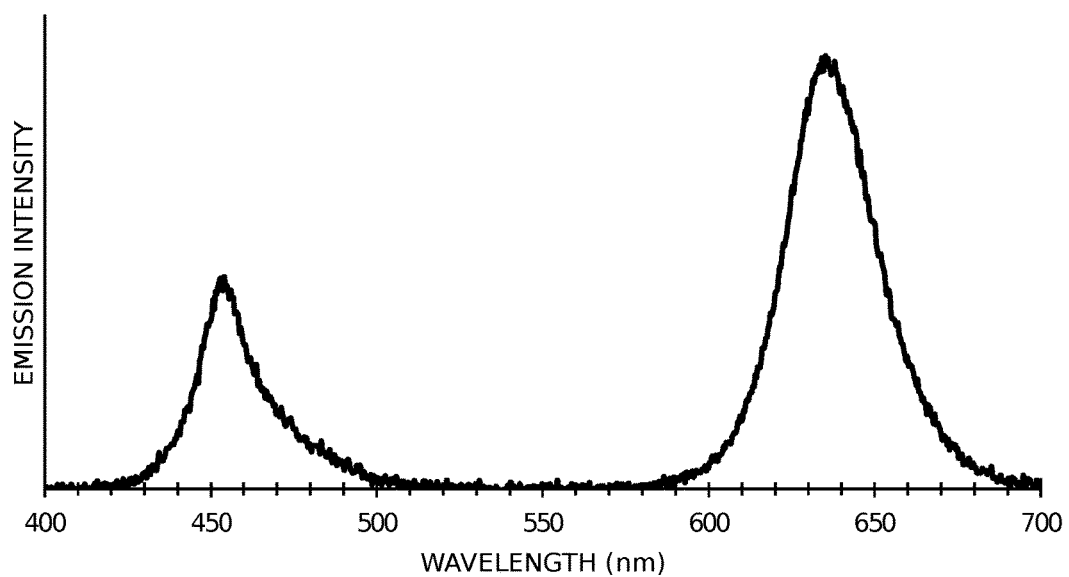

FIGS. 9A and 9B are exemplary normalized light emission intensity graphs. Assuming blue light emitting LEDs, and depending on the application (RGB display or white light for a BLU), the thickness of the QD film can be varied to increase or decrease the amount of blue light transmitted as compared to the amount of red or green light resulting from the QD color conversion. As shown in FIG. 9A, the green QD film converts a larger proportion of the blue light, while the red QD film (FIG. 9B) converts less of the blue.

Figure 10:
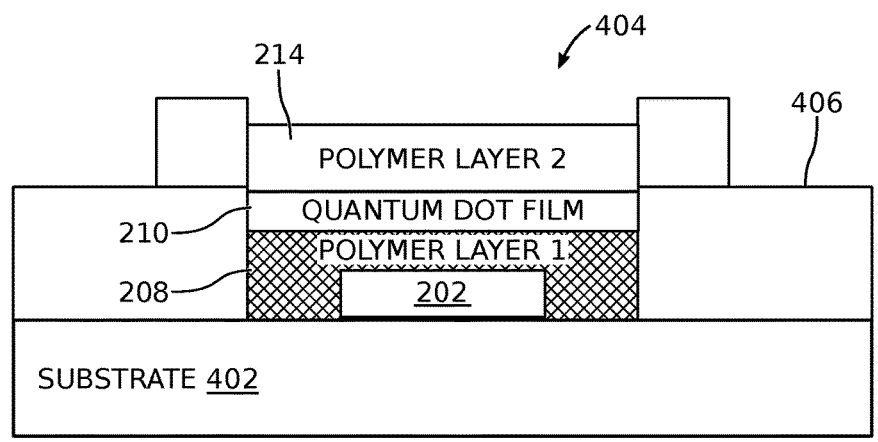
FIG. 10 is a partial cross-sectional view with vertical walls extending above the substrate surface.

FIG. 10 is a partial cross-sectional view with vertical walls extending above the substrate surface. The well 404 defines the shape and thickness of the stratified QD structure. This well structure can be defined with a photopatternable polymer, such as photoresist for example, or machined ceramic or metal structure as other examples.

Figure 11:
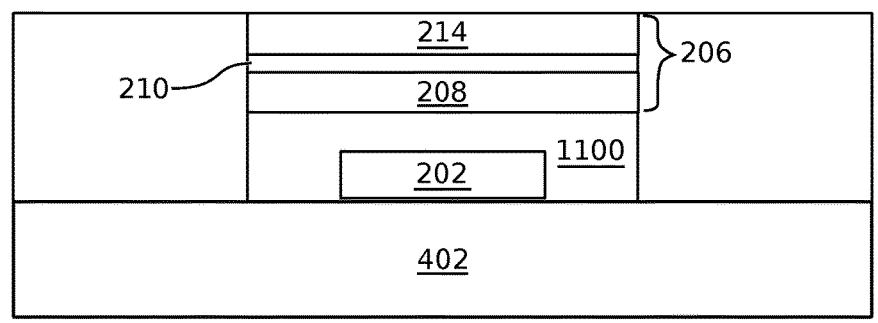
FIG. 11 is a partial cross-sectional view of a display substrate with the stratified QD structure deposited as a separate assembly over the LED.

FIG. 11 is a partial cross-sectional view of a display substrate with the stratified QD structure deposited as a separate assembly over the LED. That is, the stratified QD structure 206 may also be applied to the micro-LED 202 as a free standing (supported or unsupported) film composed of a QD layer 210 between layers of barrier material 208 and 214. This free-standing film can be placed in casual contact with the LED or applied to the surface with an adhesive for example. In this scenario the layers of the stratified QD structure are formed and processed prior to joining with the micro-LED 202. Shown is an air gap 1100 interposed between the LED 202 and the stratified QD structure 206.

The stratified QD structure can be extended to multiple QD color conversion layers as in FIG. 5. This option may be chosen if the light emitted from the LED is to be converted into multiple other colors; e.g., blue light converted to both red and green to make a white light source for example. In this way, light emitted from the LED would consist of blue, red, and green wavelengths, and would be white in appearance. Thus, the LEDs can be arranged in an array pattern on a single substrate to form an emissive display or a back light for LCD display. As shown in FIG. 6, the QD layers may be different in composition (different types of QDs) in a desired pattern to form red, green, and blue (RGB) emitting sub-pixels in an emissive display for example.

A deposition method for each of layers might need to be defined with small volume high placement accuracy in mind. A method such as inkjet or aerosol jet can be used for small volume deposition within a well structure. The barrier film in all of these examples is typically a polymer composition that can be applied as a liquid precursor. Other materials that can be used include silicones and epoxies. One epoxy that has been tested is EPO-SIL 1888 produced by Sil-More Industrial Ltd. The barrier film should be highly transparent in the optical portion of the spectrum, as well as having good thermal and mechanical properties. The QD are dispersed in a solvent such as toluene.

A typical process with example conditions for producing the stratified QD structure is as follows:
1. Produce a well structure centered on a micro-LED light source;
2. Pattern the first barrier film EPO-Sil 1888 by dispensing barrier film liquid precursor;
3. Cure barrier film by baking assembly at 125° C. in air for 1 hour;
4. Pattern the QD layer by dispensing QDs suspended in toluene, in dry inert atmosphere;
5. Evaporate toluene in a dry inert atmosphere;
6. Pattern the second barrier film EPO-Sil 1888 by dispensing barrier film liquid precursor; and,
7. Cure the barrier film by baking the assembly at 125° C. for 1 hour.

Figure 12:
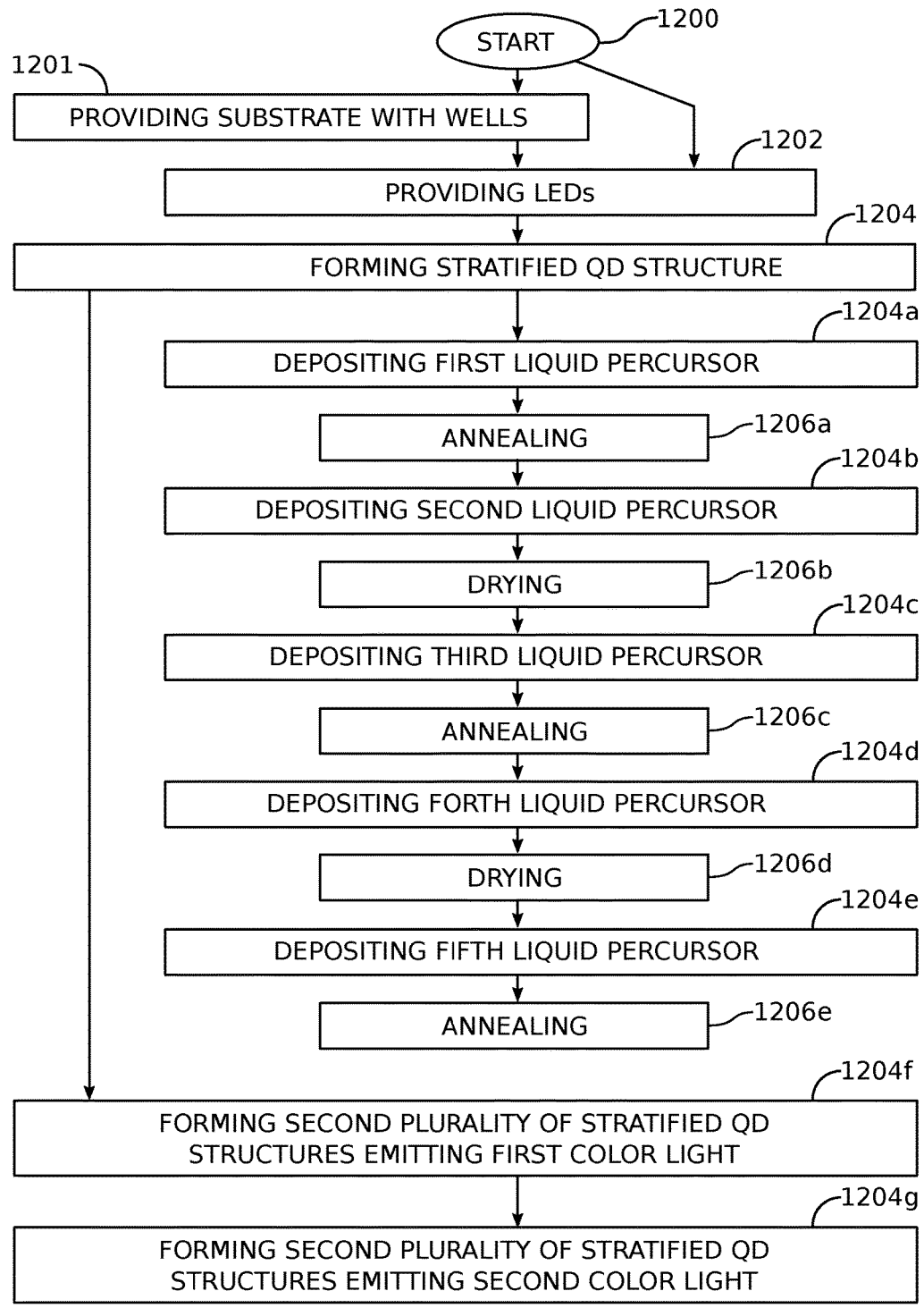
FIG. 12 is a flowchart illustrating a method for fabricating a LED device with a stratified QD structure.

FIG. 12 is a flowchart illustrating a method for fabricating a LED device with a stratified QD structure. Although the method is depicted as a sequence of numbered steps for clarity, the numbering does not necessarily dictate the order of the steps. It should be understood that some of these steps may be skipped, performed in parallel, repeated, or performed without the requirement of maintaining a strict order of sequence. Generally however, the method follows the numeric order of the depicted steps. The method starts at Step 1200.

Step 1202 provides an LED having a light emission surface. Step 1204 forms a stratified QD structure with the following substeps. Step 1204a deposits a first liquid precursor overlying the LED emission surface to form a transparent first barrier layer. Step 1204b deposits a second liquid precursor overlying the first barrier layer to form a first layer of discrete QDs. Step 1204c deposits a third liquid precursor overlying the first layer of QDs to form a transparent second barrier layer. The first and second barrier layers, respectively formed in Steps 1204a and 1204c, encapsulate the first layer of QDs. The first and second barrier layers are typically formed from an epoxy, methacrylate, silicon polymer, or alternative polymer material, with the selected material having an index of refraction greater than or equal to 1.4. The first and second barrier layers need not necessarily be composed on the same materials.

Subsequent to each barrier layer liquid precursor deposition, an annealing is performed to cure the deposited precursor, as depicted in Steps 1206a and 1206c respectively following Steps 1204a and 1204c. Subsequent to the QD layer liquid precursor deposition, a drying is performed, as depicted in Step 1206b following Step 1204b. As used herein, "annealing" to heating cycles that may introduce physical and/or chemical changes. "Drying" refers to a process that removes solvent from the liquid precursor, without introducing any physical or chemical changes.

In one aspect, the LED emission surface emits a first wavelength of light, and the first layer of QDs emit a first color of light in the visible spectrum, different than the first wavelength of light, in response to converting the first wavelength of light.

In another aspect, forming the stratified QD structure in Step 1204 includes additional substeps. Step 1204d deposits a fourth liquid precursor overlying the second barrier level to form a second layer of discrete QDs, and Step 1204e deposits a fifth liquid precursor overlying the second layer of QDs to form a transparent third barrier layer. Also shown are annealing Step 1206d and drying Step 1206e. The second layer of QDs emits a second color of light in the visible spectrum, different than the first color and the first wavelength of light, in response to converting the first wavelength of light.

In one aspect, Step 1201 provides a substrate with a plurality of wells formed in a top surface of the substrate, and Step 1202 provides a plurality of LEDs. Each LED occupies a corresponding well with the emission surface exposed. In this aspect, Steps 1204a, 1204b, and 1204c are respectively performed by depositing the first, second, and third liquid precursors in the substrate wells. If a space exists between an LED and a corresponding well sidewall, Step 1204a may fill the space with the first liquid precursor.

In a variation of this aspect, Step 1201 provides LEDs emitting a first wavelength of light. In this aspect, Steps 1204d and 1204e are respectively performed by depositing the fourth and fifth third liquid precursors in the substrate wells. The first layer of QDs emits a first color of light in the visible spectrum, different than the first wavelength of light, in response to converting the first wavelength of light. The second layer of QDs emits a second color of light in the visible spectrum, different than the first color and the first wavelength of light, in response to converting the first wavelength of light. If the first wavelength of light, first color, and second color are red, green, and blue, a white light is emitted so that a BLU substrate can be enabled.

In another aspect, Step 1201 provides a first plurality of LEDs, with each LED emission surface emitting a first wavelength of light. Then, forming the plurality of stratified QD structures in Step 1204 includes the following substeps. Step 1204f forms a second plurality of the stratified QD structures, where the second plurality is less than the first plurality. The second plurality of stratified QD structures of Step 1204f include a first layer of QDs emitting a first color of light in the visible spectrum, different than the first wavelength of light, in response to converting the first wavelength of light. Step 1204g forms a second plurality of the stratified QD structures including a first layer of QDs emitting a second color of light in the visible spectrum, different than the first color and the first wavelength of light, in response to receiving the first wavelength of light. In combination with a second plurality of visible light LEDs not covered with stratified QD structures, an RGB display is formed.

LED devices and display substrates with stratified QD structures have been presented. Examples of particular hardware configurations and process steps have been used to illustrate the invention. However, the invention is not limited to merely these examples. Other variations and embodiments of the invention will occur to those skilled in the art.

We claim:

1. A light emitting diode (LED) display comprising:
   a substrate with a plurality of wells formed in a top surface of the substrate;
   a plurality of LEDs, each LED occupying a corresponding well and having an exposed light emission surface, with a post extending from the light emission surface;
   a plurality of stratified quantum dot (QD) structures, each stratified QD structure overlying a corresponding LED and comprising:
      a transparent first barrier layer overlying the LED emission surface and post;
      a first layer of discrete QDs overlying the first barrier layer; and,
      a transparent second barrier layer overlying the first layer of QDs.

2. The display of claim 1 wherein the first and second barrier layers encapsulate the first layer of QDs.

3. The display of claim 1 wherein the first and second barrier layers are a material selected from the group consisting of epoxy, methacrylate, silicon polymer, and alternative polymer materials having an index of refraction greater than or equal to 1.4.

4. The display of claim 1 wherein the LED emission surface emits a first wavelength of light; and,
   wherein a second plurality of the stratified QD structures include a first layer of QDs emitting a first color of light in the visible spectrum, different than the first wavelength of light, in response to converting the first wavelength of light.

5. The display of claim 4 wherein each stratified QD structure further comprises:
   a second layer of discrete QDs overlying the second barrier layer; and,
   a transparent third barrier layer overlying the second layer of QDs.

6. The display of claim 5 wherein the second layer of QDs emits a second color of light in the visible spectrum, different than the first color and the first wavelength of light, in response to converting the first wavelength of light.

7. The display of claim 1 wherein a first plurality of the LED emission surfaces emits a first wavelength of light;
   wherein a second plurality of the stratified QD structures include a first layer of QDs emitting a first color of light in the visible spectrum, different than the first wavelength of light, in response to converting the first wavelength of light; and,
   wherein a second plurality of the stratified QD structures include a first layer of QDs emitting a second color of light in the visible spectrum, different than the first color and the first wavelength of light, in response to converting the first wavelength of light.

8. A method for fabricating a light emitting diode (LED) device with a stratified quantum dot (QD) structure, the method comprising:
   providing a substrate with a plurality of wells formed in a top surface of the substrate;
   providing a plurality of LEDs, each LED having a light emission surface and a post extending from the light emission surface, and each LED occupying a corresponding well with the light emission surface and post exposed;
   forming a plurality of stratified QD structures, with each stratified QD structure overlying a corresponding LED, as follows:
      depositing a first liquid precursor overlying the LED emission surface and post to form a transparent first barrier layer;
      depositing a second liquid precursor overlying the first barrier layer to form a first layer of discrete QDs; and,
      depositing a third liquid precursor overlying the first layer of QDs to form a transparent second barrier layer.

9. The method of claim 8 further comprising:
   subsequent to each barrier layer liquid precursor deposition, annealing to cure the deposited precursor; and,
   subsequent to the QD layer liquid precursor deposition, drying to remove solvent from the liquid precursor.

10. The method of claim 8 wherein the first and second barrier layers encapsulate the first layer of QDs.

11. The method of claim 8 wherein the first and second barrier layers are selected from the group consisting of epoxy, methacrylate, silicon polymer, and alternative polymer materials having an index of refraction greater than or equal to 1.4.

12. The method of claim 8 wherein the LED emission surface emits a first wavelength of light; and,
   wherein the first layer of QDs emits a first color of light in the visible spectrum, different than the first wavelength of light, in response to converting the first wavelength of light.

13. The method of claim 12 wherein forming the stratified QD structure further comprises:
   depositing a fourth liquid precursor overlying the second barrier level to form a second layer of discrete QDs; and,
   depositing a fifth liquid precursor overlying the second layer of QDs to form a transparent third barrier layer.

14. The method of claim 13 wherein the second layer of QDs emits a second color of light in the visible spectrum, different than the first color and the first wavelength of light, in response to converting the first wavelength of light.

15. The method of claim 8 wherein depositing the first liquid precursor in the corresponding well includes filling any space existing between the LED and a well sidewall with first liquid precursor.

16. The method of claim 8 wherein providing the plurality of LEDs includes providing a first plurality of LEDs, each LED emission surface emitting a first wavelength of light;
   wherein forming the plurality of stratified QD structures includes:
      forming a second plurality of the stratified QD structures including a first layer of QDs emitting a first color of light in the visible spectrum, different than the first wavelength of light, in response to converting the first wavelength of light; and,
      forming a second plurality of the stratified QD structures including a first layer of QDs emitting a second color of light in the visible spectrum, different than the first color and the first wavelength of light, in response to receiving the first wavelength of light.

17. The method of claim 8 wherein providing the plurality of LEDs includes each LED emission surface emitting a first wavelength of light;
- wherein forming the plurality of stratified QD structures includes:
  - depositing a fourth liquid precursor overlying the second barrier level to form a second layer of discrete QDs; and,
  - depositing a fifth liquid precursor overlying the second layer of QDs to form a transparent third barrier layer;
- wherein the first layer of QDs emits a first color of light in the visible spectrum, different than the first wavelength of light, in response to converting the first wavelength of light; and,
- wherein second layer of QDs emits a second color of light in the visible spectrum, different than the first color and the first wavelength of light, in response to converting the first wavelength of light.

\* \* \* \* \*